(12) United States Patent
Huang

(10) Patent No.: US 12,027,190 B1
(45) Date of Patent: Jul. 2, 2024

(54) METHOD OF FOR BONDING NOBLE METAL STRUCTURE WITH A DIELECTRIC LAYER USING AN ADHESIVE LAYER

(71) Applicant: Seagate Technology LLC, Fremont, CA (US)

(72) Inventor: Xiaoyue Huang, Edina, MN (US)

(73) Assignee: Seagate Technology LLC, Fremont, CA (US)

( * ) Notice: Subject to any disclaimer, the term of this patent is extended or adjusted under 35 U.S.C. 154(b) by 474 days.

(21) Appl. No.: 17/512,964

(22) Filed: Oct. 28, 2021

Related U.S. Application Data

(62) Division of application No. 16/816,682, filed on Mar. 12, 2020, now Pat. No. 11,189,312.

(60) Provisional application No. 62/819,751, filed on Mar. 18, 2019.

(51) Int. Cl.
| | |
|---|---|
| *G11B 5/40* | (2006.01) |
| *C23C 14/02* | (2006.01) |
| *G11B 5/255* | (2006.01) |
| *G11B 5/31* | (2006.01) |
| *G11B 5/73* | (2006.01) |
| *H01L 21/02* | (2006.01) |
| *H01L 21/285* | (2006.01) |
| *G11B 5/00* | (2006.01) |

(52) U.S. Cl.
CPC .......... *G11B 5/7375* (2019.05); *C23C 14/021* (2013.01); *G11B 5/255* (2013.01); *G11B 5/3133* (2013.01); *G11B 5/314* (2013.01); *G11B 5/40* (2013.01); *H01L 21/0206* (2013.01); *H01L 21/02065* (2013.01); *H01L 21/0228* (2013.01); *H01L 21/28562* (2013.01); *G11B 2005/0021* (2013.01); *G11B 2209/02* (2013.01); *G11B 2220/2516* (2013.01); *Y10T 428/1164* (2015.01); *Y10T 428/1193* (2015.01)

(58) Field of Classification Search
None
See application file for complete search history.

(56) References Cited

U.S. PATENT DOCUMENTS

| | | | |
|---|---|---|---|
| 8,427,925 B2 | 4/2013 | Zhao et al. | |
| 8,976,634 B2 | 3/2015 | Cheng et al. | |
| 9,058,824 B2 | 6/2015 | Cheng et al. | |
| 9,281,003 B2 | 3/2016 | Zhao et al. | |
| 9,620,150 B2 | 4/2017 | Cheng et al. | |
| 9,691,423 B2 | 6/2017 | Huang et al. | |
| 2015/0131418 A1* | 5/2015 | Huang ................. | G11B 5/4866 369/13.33 |

* cited by examiner

*Primary Examiner* — Asok K Sarkar
(74) *Attorney, Agent, or Firm* — Mueting Raasch Group

(57) ABSTRACT

A first layer that includes a metal seed layer, a refractive seed or a refractive dopant is formed on a dielectric substrate. A peg of a near-field transducer is formed on the first layer such that a first surface of the peg is formed on and is in contact with the metal seed. An adhesive layer is formed over the peg using atomic layer deposition. The adhesive layer includes alumina and is 4 nm or less in thickness. A silicon dioxide overcoat is deposited over the adhesive layer. The alumina bonds the silicon dioxide to the peg.

19 Claims, 4 Drawing Sheets

METHOD OF FOR BONDING NOBLE METAL STRUCTURE WITH A DIELECTRIC LAYER USING AN ADHESIVE LAYER

RELATED PATENT APPLICATIONS

This application is a divisional of U.S. application Ser. No. 16/816,682 filed on Mar. 12, 2020, which claims the benefit of Provisional Patent Application Ser. No. 62/819,751 filed on Mar. 18, 2019, both of which are hereby incorporated herein by reference in their entireties.

SUMMARY

The present disclosure is directed to an adhesive layer used for bonding a noble metal structure with a dielectric layer. In one embodiment, a recording head includes a structure such as a near-field transducer formed of a noble metal. An adhesive layer is formed over a surface of the structure. The adhesive layer includes alumina and is 4 nm or less in thickness. A silicon dioxide layer is formed over the adhesive layer. The adhesive layer bonds the silicon dioxide to the structure.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to heat-assisted magnetic recording (HAMR), also referred to as energy-assisted magnetic recording (EAMR), thermally-assisted recording (TAR), thermally-assisted magnetic recording (TAMR), etc. In a HAMR device, a near-field transducer (NFT) concentrates optical energy into a tiny optical spot in a recording layer, which raises the media temperature locally, reducing the writing magnetic field required for high-density recording. A waveguide delivers light to the near-field transducer and illuminates the near-field transducer. In response to the illumination, the near-field transducer generates surface plasmons that are directed (via the shape of the transducer) out of the recording head to create the hotspot on the recording medium.

One challenge in developing in HAMR products involve unpredictable lifetime of the drives. One cause for this is separation of NFT parts and voiding within regions of the NFT. Also, in order to meet linear density specs, the writer designs may include many optical elements proximate the NFT that can produce potential weak interfaces between different materials, as well as being complex to manufacture.

One challenge in fabricating a HAMR read/write head is adhering the optical dielectric materials used in waveguides and other optical structures with metallic structures made of materials such as Au, Rh, and Ir. When depositing the metals on a dielectric, a metallic seed layer can be used to provide good adhesion. For example, a thin Zr seed layer can be deposited on a silicon dioxide ($SiO_2$) base, and then Au deposited on the seed layer in-situ. The seed layer provides metal bonds that interlocks with both the dielectric below and the metal above. However, when depositing $SiO_2$ on top of the Au, in-situ metal seed solution may not work because its deposition in field may not be able to be removed after $SiO_2$ covers up.

In embodiments described below, a thin, intermediate layer of dielectric (e.g., alumina) is used to bond an overlay of $SiO_2$ with NFT materials such as Au, Rh, or Ir. It has been found that the layer, if within a certain range of thickness, can significantly increase the bonding between the $SiO_2$ with the metal. In the disclosure below, various methods and materials are described that can be used to build the various structures as part of HAMR read/write heads.

Figure 1:
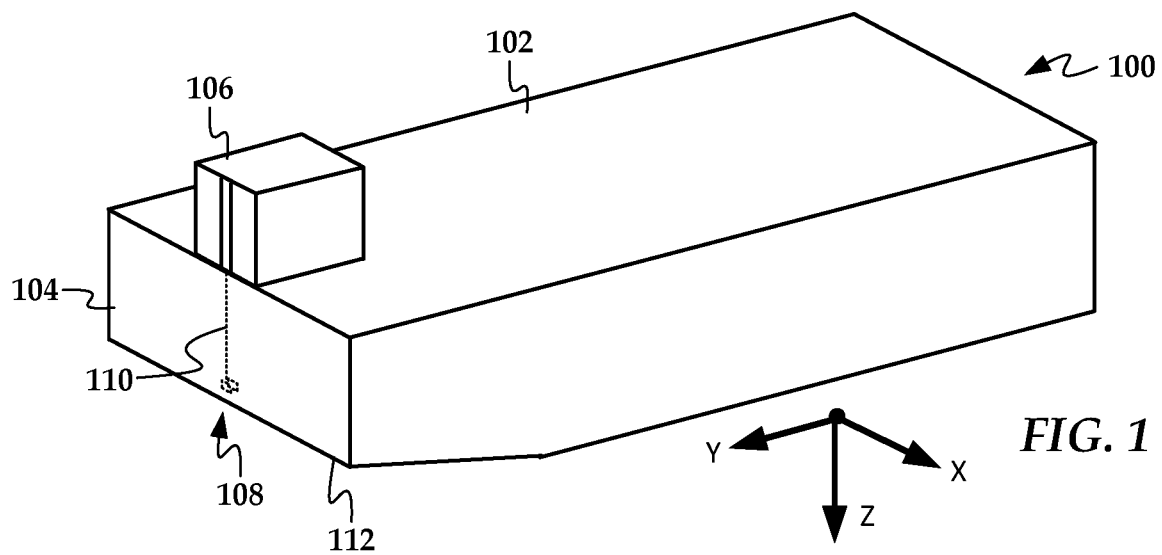
FIG. 1 is a perspective view of a slider assembly according to an example embodiment.

In reference now to FIG. 1, a perspective view shows a read/write head 100 according to an example embodiment. The read/write head 100 may be used in a magnetic data storage device, e.g., HAMR hard disk drive. The read/write head 100 may also be referred to herein interchangeably as a slider, head, write head, read head, recording head, etc. The read/write head 100 has a slider body 102 with read/write transducers 108 at a trailing edge 104 that are held proximate to a surface of a magnetic recording medium (not shown), e.g., a magnetic disk.

The illustrated read/write head 100 is configured as a HAMR device, and so includes additional components that form a hot spot on the recording medium near the read/write transducers 108. These HAMR components include an energy source 106 (e.g., laser diode) and a waveguide 110. The waveguide 110 delivers electromagnetic energy from the energy source 106 to a near-field transducer (NFT) that is part of the read/write transducers 108. The NFT achieves surface plasmon resonance and directs the energy out of a media-facing surface 112 (also referred to as the air-bearing surface, or ABS) to create a small hot spot in the recording medium.

Figure 2:
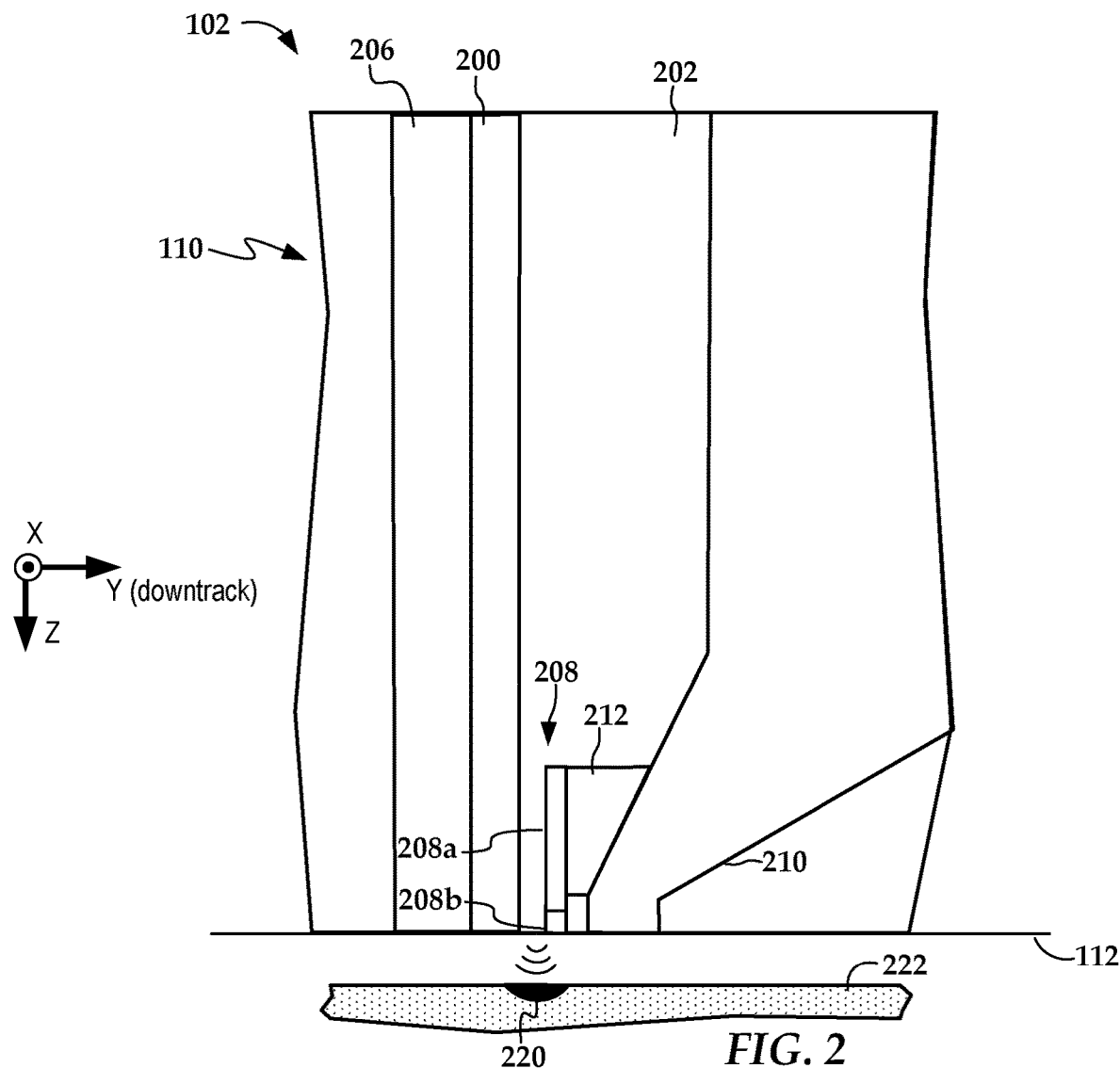
FIG. 2 is a cross-sectional view of a slider along a down-track plane according to according to an example embodiment.

In FIG. 2, a cross-sectional view shows details of a slider body 102 according to an example embodiment. As best seen in FIG. 2, the waveguide 110 includes a core 200, top cladding layer 202, and bottom cladding 206. The NFT 208 is placed near the waveguide core 200. The core 200 delivers light to the NFT 208, which is located within or near the top cladding layer 202 at the media-facing surface 112. The cladding layers 202, 206 are each formed of a dielectric material having a refractive index lower than the core 200.

In this embodiment, the NFT 208 includes two parts: an enlarged part 208*a* and a peg 208*b* that extends towards the media-facing surface 112. It should be understood that the illustrated NFT 208 is presented for purposes of illustration and not limitation. The materials, structures and techniques described herein may be applicable to other NFT shapes. A write pole 210 is located near the NFT 208. A heat sink 212 thermally couples the NFT 208 to the write pole 210. A magnetic coil (not shown) induces a magnetic field through the write pole 210 in response to an applied current. During recording, the NFT 208 forms a hotspot 220 within a recording layer of a moving recording medium 222. The write pole 210 sets a magnetic orientation in the hotspot 220, thereby writing data to the recording medium.

Figure 3:
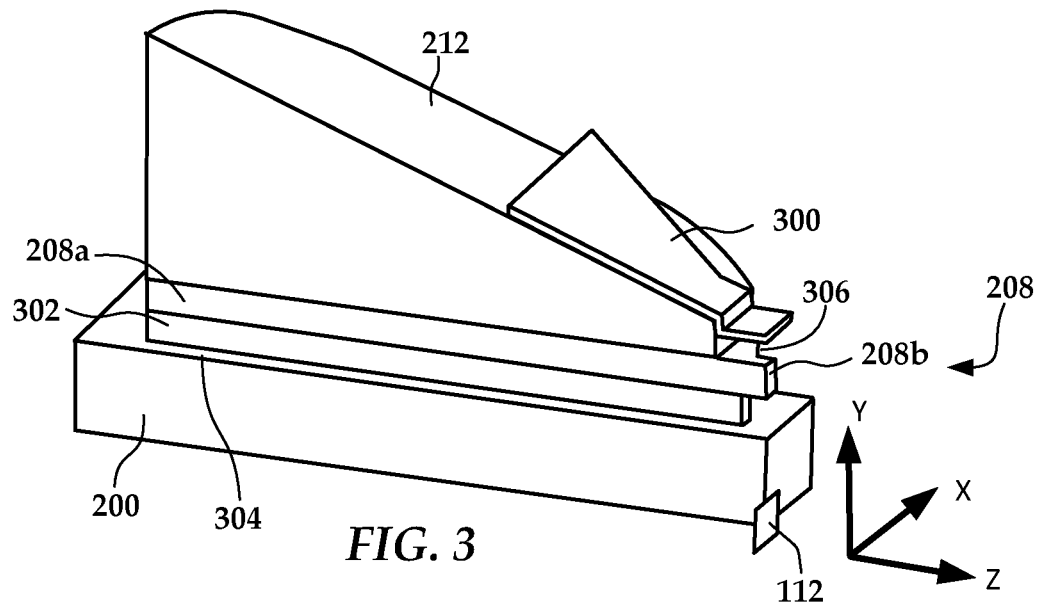
FIGS. 3 and 4 are cross-sectional views of a near-field transducer and waveguide according to an example embodiment.
Figure 4:
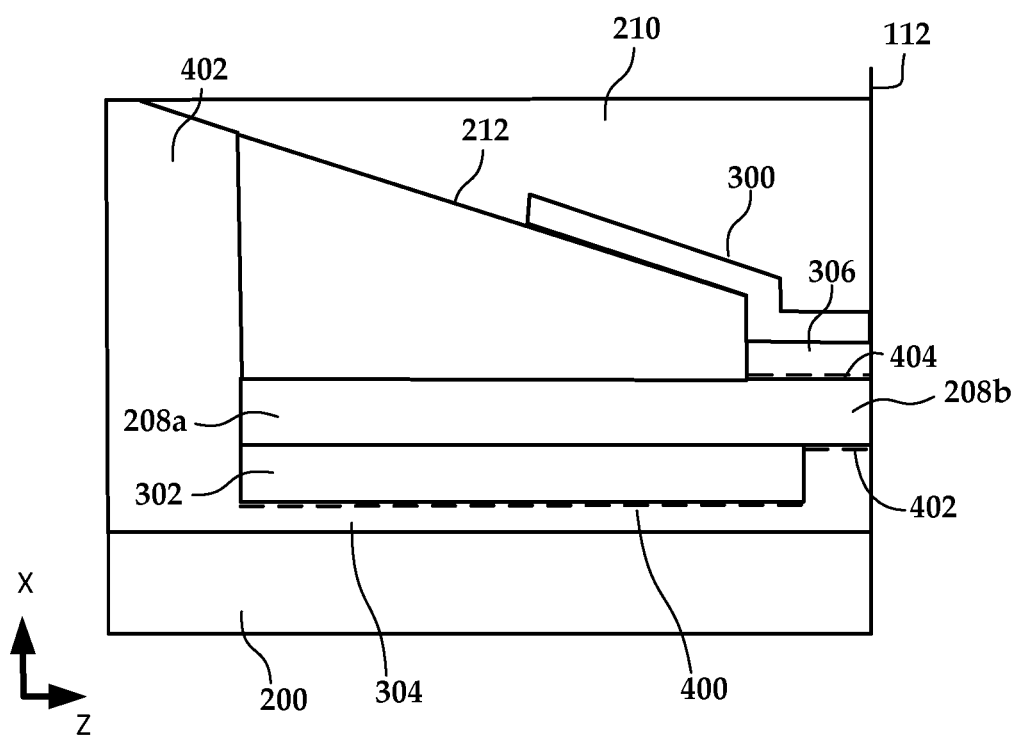

In FIGS. 3 and 4, cross-sectional views show additional details of the NFT 208 according to an example embodiment. Seen in these views is a bottom disc 302 that is between the NFT enlarged part 208a and the waveguide core 200. In some embodiments, the bottom disc 302 and heat sink 212 can be made of Au, and the NFT 208 is made from Rh or Ir. A layer 304 of dielectric (e.g., $SiO_2$ cladding material) is located between the bottom disc 302 and the waveguide core 200, and this same material may surround the rest of the NFT 208, in particular the region 306 between the peg 208b and the write pole cap 300.

Generally, the read/write head is built from the bottom up as seen in the view of FIG. 4. Thus the layer 304 is deposited over the core 200, and then the bottom disc 302 is formed over the layer 304. As indicated by dashed line 400, a thin seen layer (e.g., Zr) may first be deposited on the dielectric layer 304, which helps the metal of the bottom disc 302 adhere to the dielectric. Another seed layer 402 may be used for the peg 208b, which may be a different metal (e.g., Rh or Ir) than that of the bottom disc 302.

After formation of the peg 208b, the region 306 is deposited over the peg 208b. Because the material in the region is a dielectric, e.g., $SiO_2$, there may be problems in adherence at the interface indicated by dashed line 404. Separation or voiding at this interface 404 can negatively impact life of the storage device. Therefore, a number of materials and processes were investigated in order to improve adhesion at this interface. Generally, an adhesion layer of alumina (e.g., $Al_2O_3$) applied to the metal (in this case, the top of peg 208b) having a thickness of 4 nm or less was found to significantly improve adhesion between the metal and the $SiO_2$ overcoating due to intermixing of the $SiO_2$ with the alumina. In particular, the best results over Au were seen with a 2 nm adhesive layer of alumina. A similar result is expected for Rh and Ir.

Before depositing the adhesive layer of alumina, an atomic layer deposition (ALD) pre-clean will typically be performed on the exposed metal and surrounding surfaces. If there is refractive seed or refractive dopant around or in Au or Rh films, the pre-clean is preferred to be non-reactive plasma clean, e.g. He, Ne, Ar, Kr or Xe plasma cleaning. For example, it was found that samples that were pre-cleaned with $O_2$ had deterioration at the Kr seed layer 400 interface due to oxidation.

The deposition of the alumina can be performed using ALD. Typically, ALD deposition of alumina involves depositing an oxidant such as water ($H_2O$) or hydrogen peroxide ($H_2O_2$) followed by depositing an aluminum compound such as trimethylaluminum (TMA). When performing ALD on the noble metal structures, it improved results are achieved by depositing TMA first, followed by the oxidant (e.g., $H_2O$ or $H_2O_2$).

The materials used for the adhesive layer 404 materials can be pure $Al_2O_3$ or and intermix of $Al_2O_3$, with any of $SiO_2$, $Ta_2O_5$, $ZrO_2$, $HfO_2$, $Nb_2O_5$, $TiO_2$. While the adhesive layer 404 is shown being used between the NFT 208 and SiO2 overlay 306, this can be used for any metal structure in the read/write head, including heat sinks, mirrors, light blockers, etc. Also, this technique may be used with other noble metals besides Au, Rh, and Ir, such as Ru, Pd, Ag, Os, and Pt.

Figure 5:
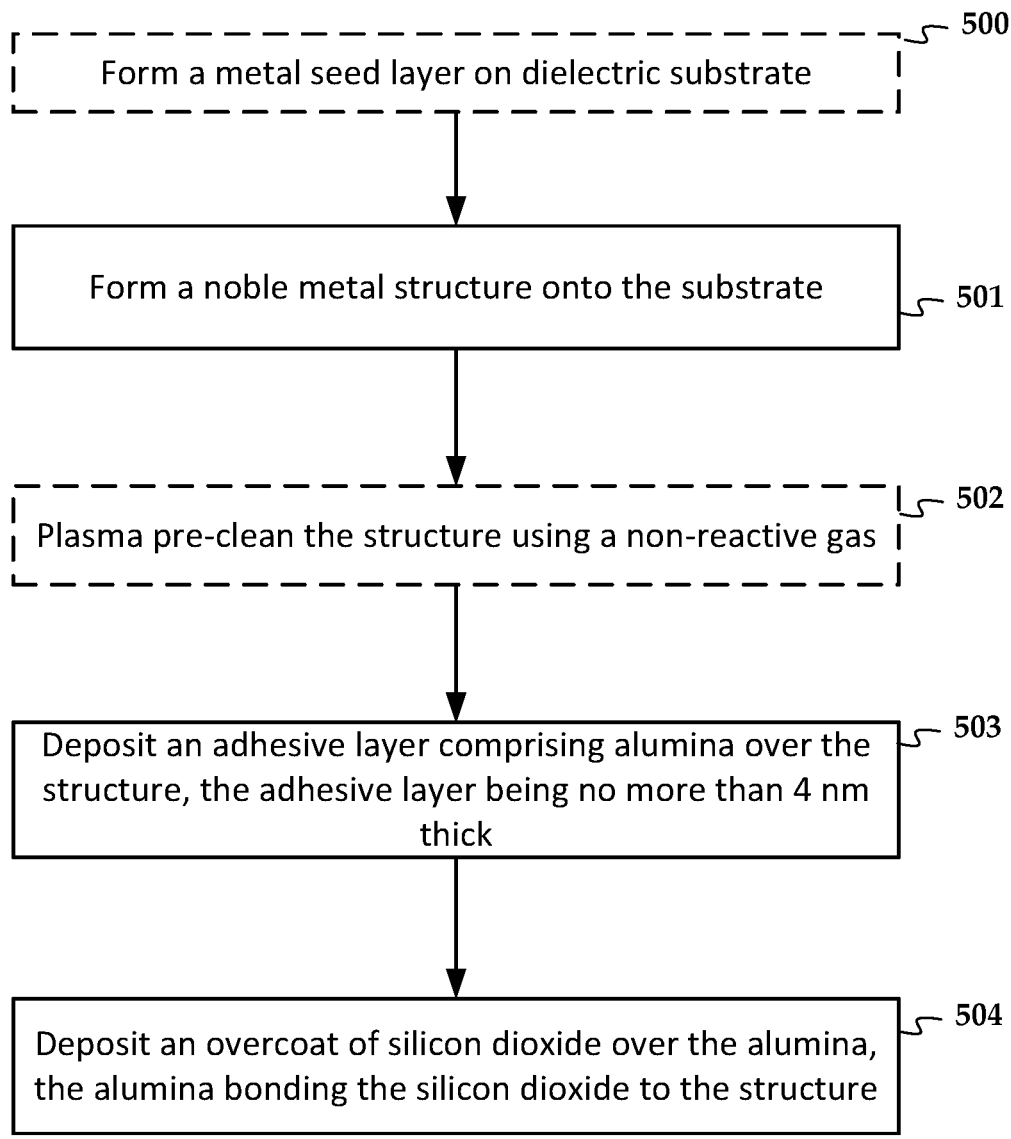
FIG. 5 is a flowchart of a method according to an example embodiment.

In FIG. 5, a flowchart shows a method according to an example embodiment. The method involves optionally forming 500 a metal seed layer on dielectric substrate. A structure formed of a noble metal 501 is deposited onto the substrate. Optionally, the structure may be plasma pre-cleaned 502 using a non-reactive gas. An adhesive layer comprising alumina is deposited 503 over the structure. The alumina may be deposited by a ALD deposition of TMA onto the noble metal structure followed by an oxidant such as $H_2O$ or $H_2O_2$. The cycles of TMA plus oxidant are repeated until the desired thickness of the adhesive layer is achieved, which is no more than 4 nm. If the oxidant is $H_2O$, then the thickness is preferably about 2 nm (e.g., ±2 angstroms). If the oxidant is $H_2O_2$, then the thickness is preferably about 1.5 nm (e.g., ±2 angstroms) An overcoat of silicon dioxide is deposited 504 over the alumina, the alumina bonding the silicon dioxide to the structure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
   forming a metal seed layer on a dielectric substrate;
   forming a peg of a near-field transducer on the metal seed layer such that a first surface of the peg is formed on and is in contact with the metal seed, the peg formed of a noble metal, the first surface being parallel to the dielectric substrate;
   depositing an adhesive layer over a second surface of the peg using atomic layer deposition, the adhesive layer comprising alumina and being 4 nm or less in thickness, the second surface being parallel and opposed to the first surface; and
   depositing a silicon dioxide overcoat over the adhesive layer, the alumina bonding the silicon dioxide to the peg.

2. The method of claim 1, further comprising cleaning the adhesive layer with a non-reactive plasma before depositing the silicon dioxide overcoat.

3. The method of claim 2, wherein the non-reactive plasma comprises at least one of He, Ne, Ar, Kr or Xe.

4. The method of claim 1, depositing the adhesive layer over the peg comprises:
   depositing trimethylaluminum (TMA) on to the peg via atomic layer deposition (ALD);
   depositing an oxidant onto the TMA via ALD; and
   repeatedly depositing additional TMA and additional oxidant until the adhesive layer reaches the thickness of 4 nm or less.

5. The method of claim 4, wherein the oxidant comprises water, and wherein the thickness is about 2 nm.

6. The method of claim 4, wherein the oxidant comprises hydrogen peroxide, and wherein the thickness is about 1.5 nm.

7. The method of claim 1, wherein the metal seed layer comprises Rh or Ir.

8. The method of claim 1, wherein the thickness of the adhesive layer is about 2 nm.

9. The method of claim 1, wherein the adhesive layer comprises the alumina intermixed with $SiO_2$.

10. A method comprising:
   forming a refractive seed or refractive dopant on a dielectric substrate;
   forming a peg of a near-field transducer on the refractive seed or refractive dopant such that a first surface of the peg is formed on and is in contact with the refractive seed or refractive dopant, the peg formed of a noble metal, the first surface being parallel to the dielectric substrate;
   depositing an adhesive layer over a second surface of the peg using atomic layer deposition, the adhesive layer comprising alumina and being 4 nm or less in thickness, the second surface being parallel and opposed to the first surface; and
   depositing a silicon dioxide overcoat over the adhesive layer, the alumina bonding the silicon dioxide to the peg.

11. The method of claim 10, further comprising cleaning the adhesive layer with a non-reactive plasma before depositing the silicon dioxide overcoat.

12. The method of claim 11, wherein the non-reactive plasma comprises at least one of He, Ne, Ar, Kr or Xe.

13. The method of claim 10, depositing the adhesive layer over the peg comprises:
   depositing trimethylaluminum (TMA) on to the peg via atomic layer deposition (ALD);
   depositing an oxidant onto the TMA via ALD; and
   repeatedly depositing additional TMA and additional oxidant until the adhesive layer reaches the thickness of 4 nm or less.

14. The method of claim 13, wherein the oxidant comprises water, and wherein the thickness is about 2 nm.

15. The method of claim 13, wherein the oxidant comprises hydrogen peroxide, and wherein the thickness is about 1.5 nm.

16. The method of claim 10, wherein the refractive seed layer comprises Rh or Ir.

17. The method of claim 10, wherein the thickness of the adhesive layer is about 2 nm.

18. The method of claim 10, wherein the adhesive layer comprises the alumina intermixed with $SiO_2$.

19. The method of claim 10, wherein the refractive seed or refractive dopant comprises a Zr seed layer.

* * * * *